US005793363A

United States Patent [19]
Takuwa

[11] Patent Number: 5,793,363
[45] Date of Patent: Aug. 11, 1998

[54] FLAT PANEL DISPLAY DRIVER

[75] Inventor: Mikio Takuwa, Kawaguchi, Japan

[73] Assignee: Texas Instruments Incorporated, Dallas, Tex.

[21] Appl. No.: 552,017

[22] Filed: Nov. 2, 1995

[30] Foreign Application Priority Data

Nov. 2, 1994 [JP] Japan .................................. 6-269758

[51] Int. Cl.[6] .............................. G09G 5/00; G11C 8/00; G06F 13/00

[52] U.S. Cl. ...................... 345/205; 345/98; 365/189.07; 365/233; 365/236; 395/840; 395/853; 395/880

[58] Field of Search ............... 345/98, 205; 365/189.07, 365/230.06, 233, 236; 377/26, 28, 39; 395/840, 853, 854, 855, 880

[56] References Cited

U.S. PATENT DOCUMENTS

| | | | |
|---|---|---|---|
| 4,513,400 | 4/1985 | Masaki | 365/236 |
| 4,660,156 | 4/1987 | Guttag et al. | 345/200 |
| 4,755,964 | 7/1988 | Miner | 365/233 |
| 5,270,696 | 12/1993 | Shin et al. | 345/98 X |
| 5,379,284 | 1/1995 | Kim | 369/44.32 |
| 5,469,386 | 11/1995 | Obara | 365/189.07 |
| 5,471,225 | 11/1995 | Parks | 345/98 |
| 5,511,170 | 4/1996 | Abdoo | 395/280 |

*Primary Examiner*—Raymond J. Bayerl
*Assistant Examiner*—Seth D. Vail
*Attorney, Agent, or Firm*—William B. Kempler; Richard L. Donaldson

[57] ABSTRACT

A semiconductor integrated circuit in which high-speed data transfer is possible and reloading of data is unnecessary when the contents of the data memory are the same as the previous contents. The timing for starting the sampling of the number of driver chips cascade connected with an output terminal and input terminal ST is provided by flip-flop 103, which is the internal counter, and only propriety for starting is executed with respect to a cascade connection, namely, input terminal ST in the next step from output terminal OUT. Therefore, the timing for transmitting a cascade signal is determined by flip-flops 103 and 104, which are the 2-bit internal counters. For example, in the case of a 2-bit counter, all that is necessary is for the cascade signal to be transmitted for two cycles so the overall transfer speed is not restricted in this part and high-speed data transfer becomes possible.

4 Claims, 4 Drawing Sheets

FLAT PANEL DISPLAY DRIVER

FIELD OF THE INVENTION

My invention relates to a semiconductor integrated circuit used in a flat panel display device and the like.

BACKGROUND

A flat panel display generally has several driving terminals and cannot be driven with a single driver chip, so it is driven using a number of drivers. FIG. 8 is a block diagram of a conventional flat panel display device. It has a flat panel display 2 driven by flat panel drivers 1-1, 1-2, and 1-3 which are coupled to a data bus DB of n bits, a clock signal $S_{CK}$, a latch strobe signal $S_{LS}$, and a start pulse signal $P_{ST}$.

Flat panel drivers 1-1, 1-2, and 1-3 each have a number of connection terminals connected in parallel to a corresponding number of drive terminals of flat panel display 2. In addition, each flat panel driver has an n-bit data input terminal D for receiving data propagated via data bus DB, a clock input terminal CK for receiving clock signal $S_{CK}$, a latch strobe input terminal LS for receiving latch strobe signal $S_{LS}$, a start pulse input terminal ST for receiving start pulse signal $P_{ST}$, and an output terminal OUT.

The data input terminal D of each flat panel driver 1-1, 1-2, and 1-3 connects in parallel to data bus DB, each clock input terminal CK connects to an input line for clock signal $S_{CK}$, and each latch strobe input terminal LS connects to an input line for latch strobe signal $S_{LS}$.

Driver 1-1 has a start pulse input terminal ST connected to an input line for start pulse signal $P_{ST}$. The output terminal OUT1 of driver 1-1 connects to the start pulse input terminal ST of driver 1-2, and the output terminal OUT2 of driver 1-2 connects to the start pulse input terminal ST of driver 1-3. That is, drivers 1-1, 1-2, and 1-3 are cascade connected by output terminals OUT and start pulse input terminals ST.

FIG. 9 shows an example of drivers 1-1 to 1-3. The flat panel driver is made of a number of shift registers 11, a data memory 12, and a display memory 13. Clock signal $S_{CK}$ from clock input terminal CK and start pulse signal $P_{ST}$ from start pulse input terminal ST are input to each shift register 11. Sampling is started by start pulse signal $P_{ST}$ and the input pulse is immediately shifted in response to the input timing of clock signal $S_{CK}$.

Data memory 12 stores data received at data input terminal D from data bus DB. When a latch strobe signal $S_{LS}$ is received, the stored data is transferred in parallel to display memory 13, and then the contents of shift register 11 are cleared.

FIG. 10 shows the relationship between clock signal $S_{CK}$, start pulse signal $P_{ST}$, the output pulse from output terminal OUT1 of driver 1-1, and the output pulse from output terminal OUT2 of driver 1-2.

A write operation of display data into a driver LSI begins with a write operation in driver 1-1 initiated when driver 1-1 receives a start pulse signal $P_{ST}$ as shown in FIG. 10. When the write operation in driver 1-1 ends, output terminal OUT1 of driver 1-1 sends a start pulse to the input terminal ST of driver 1-2, which starts the write operation of display data in driver 1-2. Then, when the write operation in driver 1-2 ends, output terminal OUT2 sends a start pulse to input terminal ST of driver 1-3 in the next step, which triggers the write operation of display data in driver 1-3.

In this way, the write operation of display data in drivers 1-1 to 1-3 is executed successively in response to the input of a start pulse $P_{ST}$. At this time, sampling of all data is executed each time and the same operation is executed in all drive chips.

However, in the conventional device, drivers 1-1 to 1-3 are cascade connected by coupling the output terminals OUT to start pulse input terminals ST, so a fixed amount of time is necessary for driving the wiring capacitance of the interchip connections and for the gate delay inside the chip, so the data write frequency to the driver LSI cannot be made too high. The highest operation frequency of the driver is often determined by the transmission speed of the start pulse. See "A Driver LSI for Color TFT-LCD" by H. Kanno et al. of OKI Electric Industry Co., Ltd., Technical Report EID92-116, ED92-149(February 1992) of The Institute of Electronics, Information and Communication Engineers, p. 17., incorporated herein by reference. Therefore, the conventional arrangement is not suitable for high-speed data sampling. Even if the contents of the data memory are the same as in the previous cycle, all data must be reloaded each time.

Accordingly, one object of my invention is to provide a semiconductor integrated circuit in which high-speed data transfer is possible without having to reload the data when the contents of the data memory 12 are the same as in the previous cycle.

SUMMARY OF INVENTION

A first semiconductor integrated circuit of my invention has a number of driving circuits connected respectively to a number of drive targets arranged parallel, a number of memory circuits respectively connected electrically to the number of driving circuits, and a timing adjusting circuit which adjusts the input timing of the second enable signal fed from the outside based on the clock signal and first enable signal fed from the outside, and the driving data fed from the outside according to the clock signal is successively stored in the number of memory circuits with the input timing of the second enable signal adjusted by the timing adjusting circuit as the starting point.

The semiconductor integrated circuit of my invention feeds a signal corresponding to the second enable signal to the cascade connected semiconductor integrated circuit in the next step at least for one clock pulse of the clock signal before the timing at which all the driving data of the number of memory circuits is stored.

A second semiconductor integrated circuit embodiment has a number of driving circuits connected respectively to the number of drive targets arranged in parallel, the number of memory circuits respectively connected electrically to the number of driving circuits, a first counter which is set to the initial state by the enable signal fed from the outside and executes a count operation according to the clock signal fed from the outside, a second counter which is set to the initial state by the enable signal and executes a count operation according to the count indication signal fed from the first counter, a coincidence detecting circuit which detects the coincidence of the count value of the second counter and the address information fed from the outside, and the number of decoders which are respectively connected electrically to the number of memory circuits, activated by the enable signal fed from the coincidence detecting circuit, and indicates storage of driving data fed from the outside part with respect to the memory circuit according to the count value of the first counter, and the first counter feeds a count indication signal to the second counter when a count value corresponding to the number of the number of decoders is counted, and the a coincidence detecting circuit feeds an enable signal to the number of decoders when the count value of the second counter and the address information are coincident.

The first semiconductor integrated circuit according to my invention determines the timing for the storage operation of the driving data fed from the outside into the memory circuit based on the clock signal of the first and second enable signals. The clock signals and the first enable signals are fed in the same manner to the cascade-connected semiconductor integrated circuits, and the second enable signals are successively transferred from the semiconductor integrated circuit positioned at the head to the semiconductor integrated circuit in the next step.

The input timing of the second enable signal indicating the storage of the driving data is determined by the first enable signal and clock signal and if the second enable signal is already fed at the timing, the storage operation of the driving data is started and the starting time of the pertinent storage operation is not restricted by the transfer speed of the second enable signal in the semiconductor integrated circuit.

The second semiconductor integrated circuit according to my invention has first and second counters set by a common enable signal and is constructed to start the storage operation of the driving data when the count value of the second counter and the address information fed from the outside are coincident so when the number of semiconductor integrated circuits are cascade connected, the storing order of the driving data is determined by the setting of the address information without successively feeding the start signal indicating storage of the driving data from the semiconductor integrated circuit in the initial step to the semiconductor integrated circuit in the next step.

Figure 1:
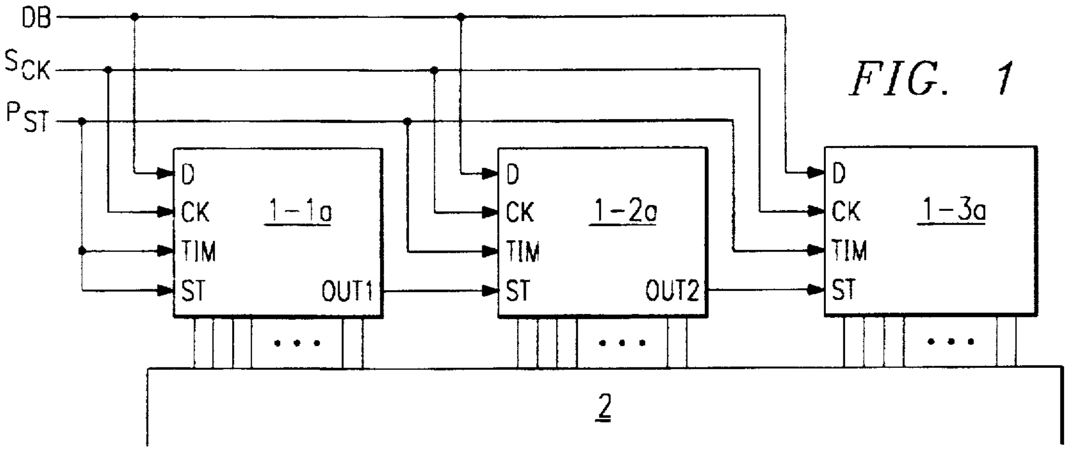
FIG. 1 is a block diagram of a first embodiment of a semiconductor integrated circuit according to my invention.

In the drawings., 1-1*a*, 1-2*a*, 1-3*a* are flat panel drivers, 101–104 D-type flip-flops, 105 an SR-type flip-flop, 106, 107 two-input AND gates, 108 an inverter, 1-1*b*, 1-2*b*, 1-3*b* flat panel drivers, 111 a decoder, 112 a data memory, 113 a display memory, 114, 115 counters, 116 a coincidence detecting circuit, 117 an output circuit, 118, 119 two-input AND gates, 120 an inverter.and 2 a flat panel display.

DETAILED DESCRIPTION

First Embodiment

FIG. 1 shows a first embodiment of a semiconductor integrated circuit related to my invention. Items 1-1*a*, 1-2*a*, and 1-3*a* are flat panel drivers, 2 a flat panel, DB a data bus of n bits, $S_{CK}$ a clock signal, and $P_{ST}$ a start pulse signal.

In flat panel drivers 1-1*a*, 1-2*a*, and 1-3*a*, the number of connection terminals are connected in parallel with respect to the number of drive terminals of flat panel display 2, and in addition to the connection terminals, there are data input terminal D for inputting data which propagates through data bus DB, clock input terminal CK for inputting clock signal $S_{CK}$, start pulse input terminal ST for inputting start pulse signal $P_{ST}$, and output terminal OUT, and in addition, it has second start pulse input terminal TIM. Though not shown in FIG. 1, in actuality there is latch strobe input terminal LS for inputting latch strobe signal $S_{LS}$.

Data input terminal D of each flat panel driver 1-1*a*, 1-2*a*, and 1-3*a* is connected in parallel with data bus DB, clock input terminal CK to the input line of clock signal $S_{CK}$, and second start pulse input terminal TIM to the input line of start pulse signal $P_{ST}$, respectively.

Start pulse input terminal ST of driver 1-1*a* is connected to the input line of start pulse signal $P_{ST}$, output terminal OUT1 of driver 1-1*a* is connected to start pulse input terminal ST of driver 1-2*a*, and output terminal OUT2 of driver 1-2*a* is connected to start pulse input terminal ST of driver 1-3*a*.

Drivers 1-1*a*, 1-2*a*, and 1-3*a* are constituted such that start pulse signal $P_{ST}$ is input in parallel to input terminal TIM and starts the sampling with the pulse input to input terminal ST.

Figure 2:
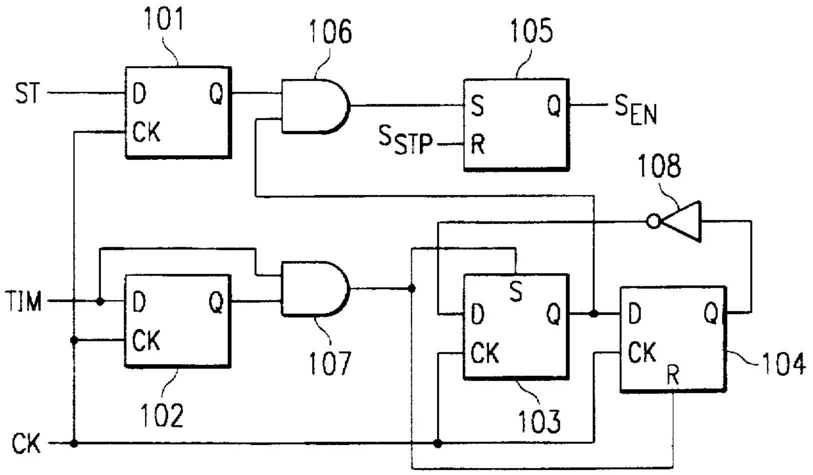
FIG. 2 is a schematic of an example of the main part in the flat panel driver of FIG. 1.

FIG. 2 is a schematic showing a concrete constitutional example of the main part in the flat panel drivers 1-1*a*, 1-2*a*, and 1-3*a*.

Flat panel drivers 1-1*a*, 1-2*a*, and 1-3*a* include a circuit constituted of D-type flip-flops 101–104, SR-type flip-flop 105, two-input AND gates 106 and 107, and inverter 108 as shown in FIG. 2.

The clock input of flip-flops 101–104 is connected to input terminal CK for clock signal $S_{CK}$. The D input of flip-flop 101 is connected to input terminal ST for start pulse signal and the Q output is connected to one input terminal of AND gate 106.

The D input of flip-flop 102 is connected to second start pulse input terminal TIM and the Q output is connected to one input terminal of AND gate 107. The other input terminal of AND gate 107 is connected to second start pulse input terminal TIM and the output terminal is connected to reset terminal R of flip-flop 104 and set terminal S of flip-flop 103.

The D input of flip-flop 103 is connected to the output terminal of inverter 108 and the Q output is connected to the other input terminal of AND gate 106 and the D input of flip-flop 104. The Q output of flip-flop 104 is connected to the input terminal of inverter 108.

Furthermore, the output terminal of AND gate 106 is connected to the S input of flip-flop 105. The R input of flip-flop 105 is connected to the input line of stop signal $S_{STP}$ and the Q output is connected to the output line of sampling enable signal $S_{EN}$.

In a flat panel driver with this type of constitution, timing of data sampling is controlled by AND gate 106. This timing is provided by AND gate 107 and flip-flops 102–104. Flip-flops 103 and 104 constitute a 2-bit counter and the output of the flip-flops 103 and 104 is binary and the count is started with "10." Discrepancy of 2 bits by the 2-bit counter is allowed.

Next, the operation according to the constitution will be explained with reference to the timing diagram in FIG. 3.

Clock signal $S_{CK}$ is fed respectively to input terminal CK of each flat panel driver 1-1*a*, 1-2*a*, and 1-3*a* and start pulse signal $P_{ST}$ is fed to input terminal TIM.

In accordance with the input of start pulse signal $P_{ST}$ and clock signal $S_{CK}$, flip-flop 102 outputs a signal at a high level from output Q by synchronizing with clock signal $S_{CK}$ in each flat panel driver 1-1*a*, 1-2*a*, and 1-3*a*. At this time, start pulse signal $P_{ST}$ is input at a high level, so the signal at a high level is output to reset terminal R of flip-flop 104 and set terminal S of flip-flop 103 from AND gate 107.

By it, flip-flop 103 takes on the SET state, flip-flop 104 takes on the RESET state, the output of flip-flop 103 takes on a high level of "1," and the output of flip-flop 104 takes on a low level of "0." The value of the 2-bit counter comprised of flip-flops 103 and 104 becomes "10."

At this time the 2-bit counters in all flat panel drivers 1-1*a*, 1-2*a*, and 1-3*a* synchronize and change with the same timing thereafter.

To flat panel driver 1-1*a* of the initial step, start pulse signal $P_{ST}$ is input to input terminal ST so flip-flop 101 outputs a signal at a high level from output Q by synchronizing with clock signal $S_{CK}$.

At this time, if a signal at a high level is output from Q output of flip-flop 103, the output of AND gate 106 goes to the high level, flip-flop 15 is set to a high level, sampling enable signal $S_{EN}$ is output at a high level to a shift register (FIG. 9) not shown in the figure from the Q output, and sampling of data is started.

In this example, sampling of one driver is completed with 40 clock signals $S_{CK}$ and the next driver starts at the 41st clock signal.

Figure 3:
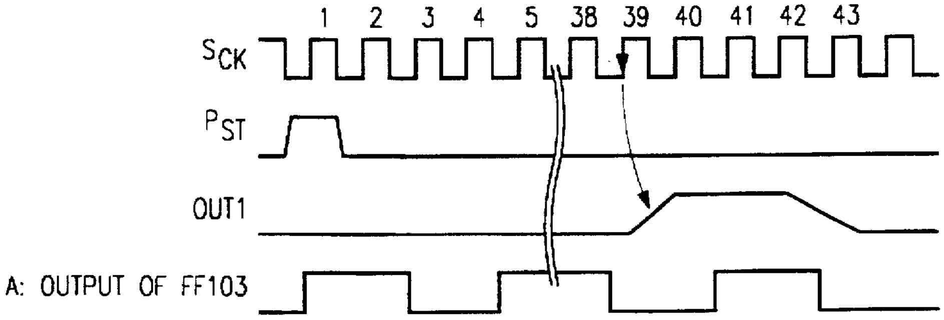
FIG. 3 is a timing diagram of the operation in FIGS. 1 and 2.

As shown in the timing diagram in FIG. 3, a signal at a high level is output to input terminal ST of second step driver 1-2*a* from output terminal OUT1 at the 39th clock signal $S_{CK}$ in driver 1-1*a* of the initial step.

In second step driver 1-2*a*, which receives signals from output terminal OUT1, the logical product of the output of flip-flop 101 and the output of flip-flop 103 composing a counter is obtained in AND gate 106 even if the signal is read at the 40th clock signal $S_{CK}$, or read at the 41st clock signal $S_{CK}$, so it starts at the 41st clock signal $S_{CK}$ in either case.

By it, timing of a cascade connection can double the time of the conventional technology.

As explained above, according to the first embodiment, the timing for starting the sampling of cascade-connected driver chips 1-2*a* and 1-3*a* is provided from flip-flop 103, which is the internal counter, and only the propriety for starting is executed by the conventional cascade connection, i.e., by the propagation of a start pulse of input terminal ST in the next step from output terminal OUT. Consequently, the time at which the cascade signal (start pulse) is to be transmitted is determined by flip-flops 103 and 104, which are internal counters of 2 bits. For example, in the embodiment, all that is necessary is for a cascade signal to be transmitted for two cycles since it is a 2-bit counter, thus the overall transmission rate is not restricted by this part and high-speed data transmission becomes possible.

By it, an improvement in the operating frequency can be realized by simply adding a few circuits.

In the circuit, a TIM terminal is newly provided as an input terminal for providing a timing reference, but in a regular panel driver, it may be used for providing a timing reference for the signal connected to all drivers, for example, latch strobe signal $S_{LS}$ which transmits the data for executing sampling and resetting to the display memory, etc.

Figure 8:
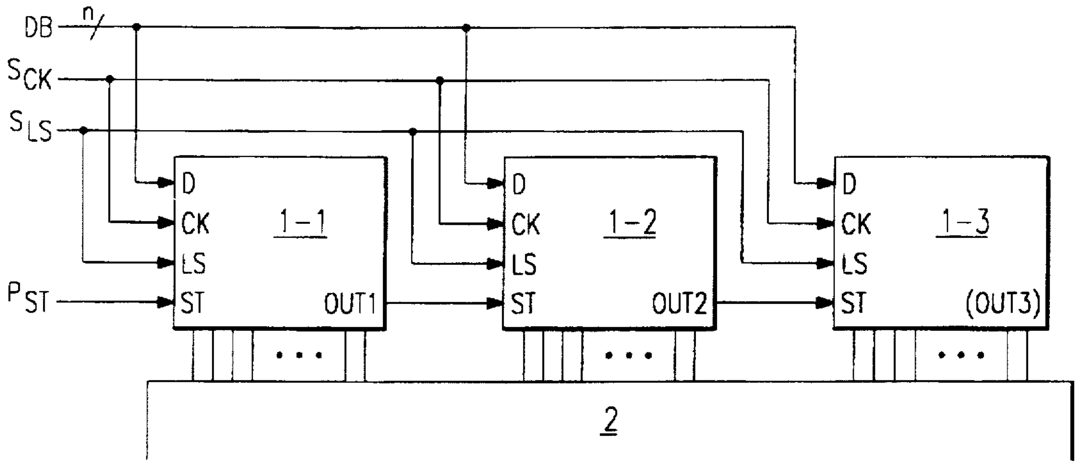
FIG. 8 is a block diagram of a conventional flat panel display device having a number of flat panel drivers.

The circuit connection in this case is the same as that in FIG. 8. Specifically, it can be realized by connecting the input line of latch strobe signal $S_{LS}$ to input terminal TIM in FIG. 2 which shows a constitutional example of the main part in drivers 1-1*a*, 1-2*a*, and 1-3*a*.

Figure 4:
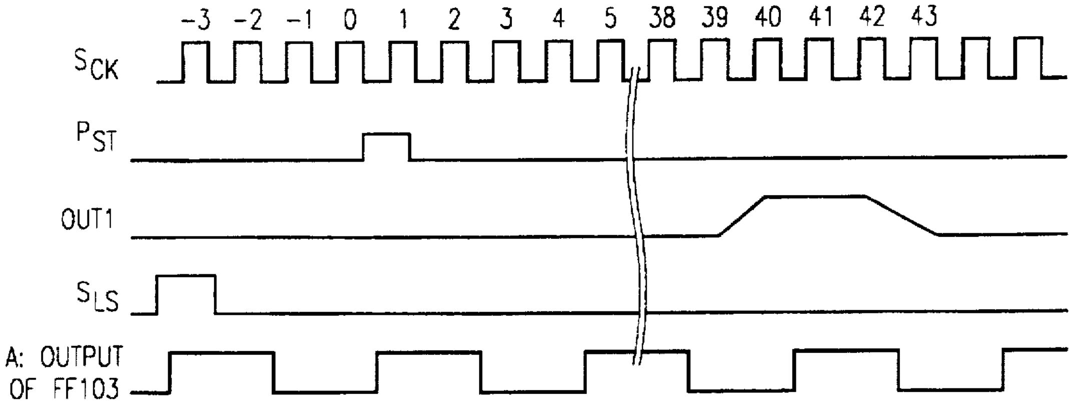
FIG. 4 is a timing diagram for a case in which latch strobe signals are used.

FIG. 4 shows the timing diagram for such a case. The counter which counts the timing reference is changed after four cycles of clock signals $S_{CK}$, so the input of latch strobe signal $S_{LS}$ can provide the timing by executing input before the integer multiple of four cycles from the timing for inputting start pulse $R_{ST}$.

In this way, even in a constitution using latch strobe signals, the effect of high-speed transmission becoming possible like in the aforementioned effect can be realized. The 2-bit counter is composed of flip-flops 103 and 104, but this counter is not limited to 2 bits and can be 3 bits, 4 bits, or more by increasing the step count of the flip-flop.

Second Embodiment

Figure 5:
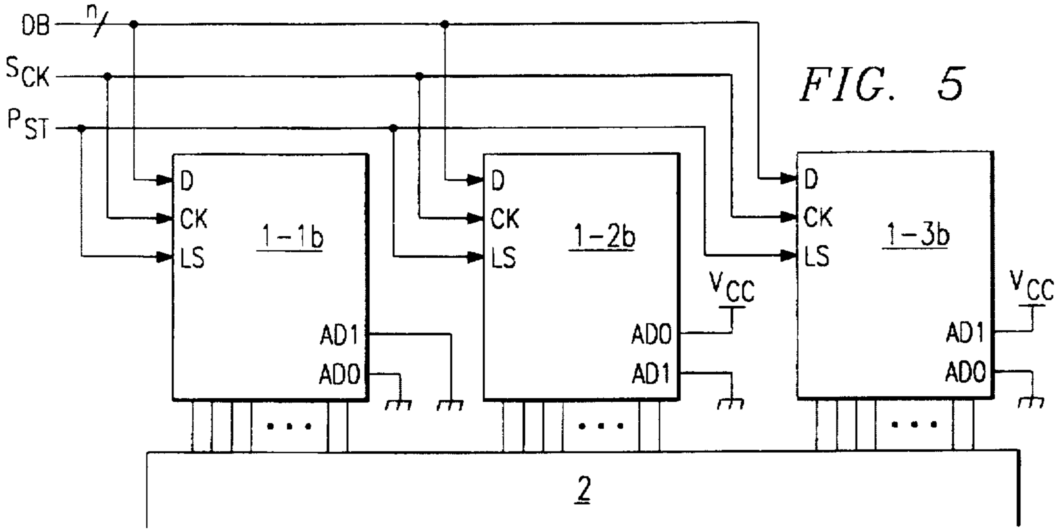
FIG. 5 is a block diagram of a second embodiment of a semiconductor integrated circuit according to my invention.

FIG. 5 shows a second embodiment of a semiconductor integrated circuit according to my invention. The point which differs in this second embodiment from the circuit in FIG. 8, which shows a conventional example, is that there is no input terminal for the start pulse signal and cascade connection and it is provided with terminals AD0 and AD1 for indicating the starting order for the sampling of flat panel drivers 1-1*b*, 1-2*b*, and 1-3*b*.

The starting order for the sampling is set as drivers 1-1*b*, 1-2*b*, 1-3*b*. Specifically, both terminals AD0 and AD1 of driver 1-1*b* are grounded, terminal AD0 of driver 1-2*b* is connected to the supply line of power voltage $V_{CC}$, and terminal AD1 is grounded. Terminal AD0 of driver 1-3*b* is grounded and terminal AD1 is connected to the supply line of power voltage $V_{CC}$.

By it, order "00" is provided to driver 1-1*b*, order "01" is provided to driver 1-2*b*, and order "02" is provided to driver 1-3*b*.

Figure 6:
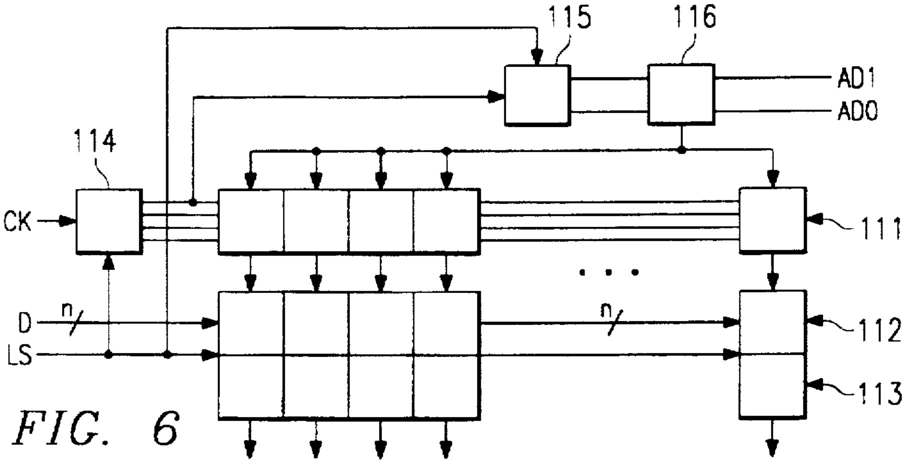
FIG. 6 is a block diagram of an example of the main part in the flat panel driver of FIG. 5.

FIG. 6 is a schematic showing a concrete constitutional example of the main part in flat panel drivers 1-1*b*, 1-2*b*, and 1-3*b* of FIG. 5. Flat panel drivers 1-1*b*, 1-2*b*, and 1-3*b* are comprised of decoder 111, data memory 112, display memory 113, counters 114 and 115, and a coincidence detecting circuit 116.

Figure 9:
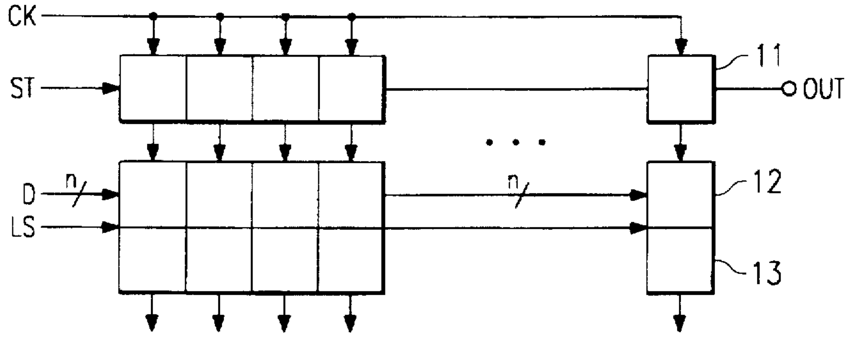
FIG. 9 is a block diagram of a main part in the flat panel drivers of FIG. 8.
Figure 10:
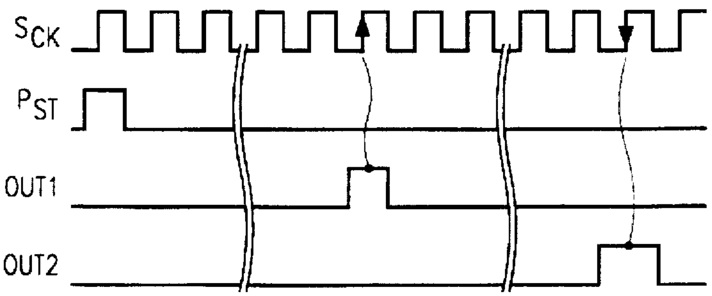
FIG. 10 is a timing diagram showing the relationship between a clock signal, a start pulse signal and output pulses from the output terminals of the drivers in the circuit of FIG. 8.

This circuit composes the circuit which indicates the writing position with counter 114 and the number of decoders 111 instead of the conventional shift register (11 in FIG. 9) shown in FIG. 9, and it is constructed to input the output of a coincidence detecting circuit 116 to the decoder and to execute control regarding whether to enable sampling or not.

Clock signal $S_{CK}$ input from clock input terminal CK is fed to counter 114, and along with providing the output of counter 114 to decoder 111, carrier of counter 114 is provided to counter 115. The output of counter 115 is provided to a coincidence detecting circuit 116.

A coincidence detecting circuit 116 is connected with terminals AD0 and AD1, detects whether the output of counter 115 and the sampling order provided via the terminals AD0 and AD1 are coincident or not, and outputs the result to decoder 111.

Then, sampling is started by providing the output of decoder 111 to data memory 112 and data of data bus DB input from data input terminal D is stored in data memory 112 at the timing of each decoder output.

Then, when latch strobe signal $S_{LS}$ is input, the stored data thereof is transferred in parallel to display memory 13 [sic; 113]. At this time, the contents of counters 114 and 115 are reset.

Counters 114 and 115 are binary counters, counter 114 executes counting by simply using the number of the number of decoders 111, and outputs carrier to counter 115 at the point in time the count value exceeds the number of decoders 111. Counter 115 is incremented according to the carrier output from counter 114.

In actuality, sampling is started at the point in time the latch strobe signal $S_{LS}$ is input and the contents of counters 114 and 115 are reset.

Since terminals AD0 and AD1 of flat panel driver 1-1*b* are "00," a coincidence result of the output of counter 115 with terminal data "00" is obtained in a coincidence detecting circuit 116 of driver 1-1*b* at the start of sampling after the reset. In other drivers 1-2*b* and 1-3*b*, sampling is started only in driver 1-1*b* of the initial step since the coincidence result is not obtained.

When sampling in driver 1-1*b* is completed, counter 115 of driver 1-2*b* is incremented. Since terminals AD0 and AD1 of second step driver 1-2*b* is "01, " a coincidence result of the output of counter 115 with terminal data "01" is obtained in a coincidence detecting circuit 116 of driver 1-2*b*. In other drivers 1-1*b* and 1-3*b*, sampling is started only in driver 1-2*b* of the second step since a coincidence result is not obtained.

Similarly, when the sampling in driver 1-2*b* is completed, counter 115 of driver 1-3*b* is incremented. Since terminals AD0 and AD1 of third step driver 1-2*b* are "10," a coincidence result of the output of counter 115 with terminal data "10" is obtained in a coincidence detecting circuit 116 of driver 1-3*b*. In other drivers 1-1*b* and 1-2*b*, sampling is started only in third step driver 1-2*b* since a coincidence result is not obtained.

In this way, in this embodiment, sampling is executed successively in drivers 1-1*b*, 1-2*b*, and 1-3*b* according to the sampling order set beforehand without executing cascade connection.

Reloading only the value of a specific data memory of a specific driver is possible if the value of counters 114 and 115 can be input and set from the outside.

Figure 7:
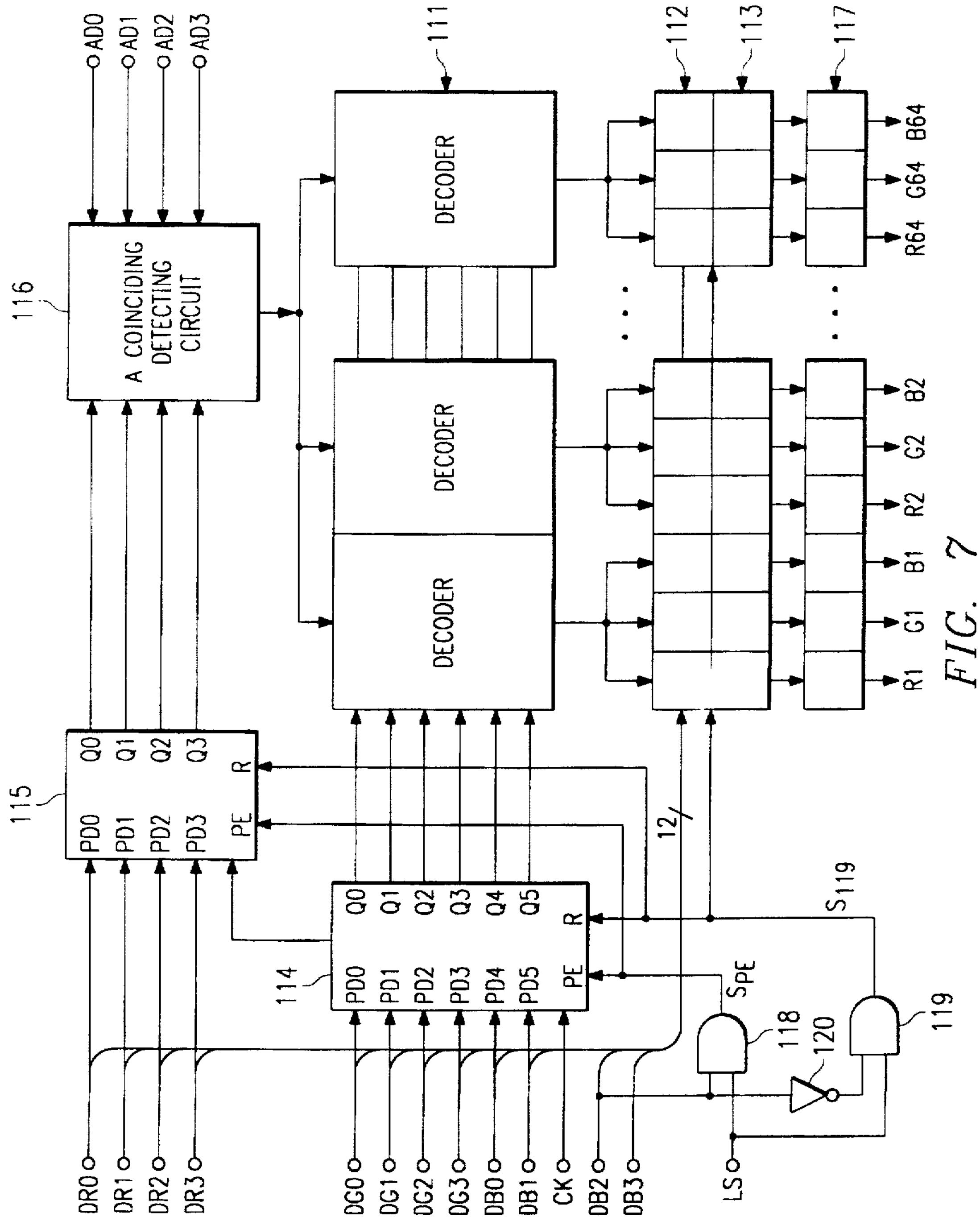
FIG. 7 is a block diagram of the main part of a 192-output 16-gray scale color (RGB three color) driver with counter preset function added to the circuit in FIG. 6.

FIG. 7 is a block diagram showing a constitutional example of a 192-output 16-gray scale color (RGB three color) driver with a counter preset function attached to the circuit in FIG. 6.

In this circuit, counter 114 is a 6-bit counter and counter 115 is a 4-bit counter. To counter 114, G (green) 4-bit data DG0–DG3, B (blue) upper 2-bit data DB0 and DB1, clock signal $S_{CK}$, preset enable signal $S_{PE}$, and latch strobe signal $S_{119}$ are fed.

To counter 115, R (red) 4-bit data DR0–DR3, carrier output of counter 114, preset enable signal $S_{PE}$, and latch strobe signal $S_{119}$ are fed.

Preset enable signal $S_{PE}$ is obtained by obtaining the logical product of B (blue) lower bit data DB3 and latch strobe signal $S_{LS}$ at AND gate 118 and is fed to terminal PE of counters 114 and 115.

On the contrary, signal $S_{119}$ is obtained by obtaining the logical product of the data which inverted B (blue) lower bit data DB3 in inverter 120 and latch strobe signal $S_{LS}$ in AND gate 119 and is fed to data memory 112 and reset terminal R of counters 114 and 115.

Output circuit 117 is provided to the output side of display memory 113.

Furthermore, four terminals AD0–AD3, which determine the starting order of the sampling, are connected to a coincidence detecting circuit 116.

In this circuit, which output position in 6-bit counter 114 to which data is to be written is selected and when the sampling of the information arranged and positioned in 4-bit counter 115 is to be started are controlled.

In this example, it is possible to mount a maximum of 16 units to one panel since it is 4 bits.

In the constitution in FIG. 7, it becomes the same operation as the circuit in FIG. 6 if data DB3 is set to a low level when inputting latch strobe signal $S_{LS}$ from AND gate 119.

Signal $S_{119}$ of a high level is created by AND gate 119, data transfer from data memory 112 to display memory 113 is executed by it, and counters 114 and 115 are reset.

Therefore, by setting data DB3 to a low level and executing input of latch strobe signal, the same operation as the conventional driver, which reloads all the data in all drivers 1-1*b*, 1-2*b*, and 1-3*b* sequentially, is executed.

Next, when latch strobe signal $S_{LS}$ is input with data DB3 in the high level state, preset enable of counters 114 and 115 becomes active, the values of data DG0–DG3, DB0, and DB1 are preset in counter 114, and values of data DR0–DR3 are preset in counter 115.

In this way, it is possible to start writing data from any location where reloading of data is to be executed.

As explained above, according to the second embodiment, timing for starting the sampling is provided by counters 114 and 115 so transmission (cascade connection) of the start pulse between the drivers is not necessary like in the conventional technology. Consequently, high-speed data writing becomes possible.

Counter 114 has the same function as the conventional shift register (11 in FIG. 9): it is a pointer indicating the position for writing the data, so it becomes a replacement for the shift register. Therefore, it does not increase the chip area.

The additional AD input terminal does not influence the AC characteristics since a fixed potential of high level or low level is provided.

Furthermore, by allowing the count value of counters 114 and 115 to be set from the outside like the circuit in FIG. 7, it is possible to reduce the power consumption since reloading does not have to be done when the data is the same as the previous line.

For example, reloading only the part of the data that changes from the previous display line becomes possible. In particular, in the case of OA application, the frequency of a display pattern with much of the same data parts as the previous line is high, thus the data reloading frequency of the driver can be decreased considerably and reduction in power consumption becomes possible.

Even if a partial reload function is added, it can be realized with the same number of connection lines as the conventional technology without increasing the interface (signal line) to drivers 1-1*b* to 1-3*b* and the controller.

As explained above, according to the semiconductor integrated circuit of my invention, the overall transfer rate is not restricted, so high-speed data transfer becomes possible.

It is possible to avoid reloading when there is data that is identical to that in the previous line, so a reduction in power consumption can be realized.

We claim:

1. A semiconductor integrated circuit comprising:

a clock input for receiving a clock signal;

first and second enable inputs for respectively receiving first and second enable signals;

a data input for receiving driving data in response to the clock signal;

a number of drive circuits respectively coupled to a number of drive targets arranged in parallel;

a number of memory circuits respectively coupled to the drive circuits;

a timing adjusting circuit for adjusting the timing of the second enable signal based on the clock signal and the first enable signal; and a circuit for storing the driving data in the memory circuits in response to the second enable signal as adjusted by the timing adjusting circuit.

2. The circuit of claim 1, further including a circuit for feeding a signal corresponding to the second enable signal to a cascade-connected semiconductor integrated circuit in the next step at least one clock pulse of the clock signal before the time at which all the driving data is stored in the memory circuits.

3. The circuit of claim 1 wherein the timing adjusting circuit comprises:

a counter, set to an initial state by the first enable signal, for executing a count operation at a prescribed cycle according to the clock signal; and a gate circuit for sending an enable signal indicating the start of the storage operation of the driving data in the memory circuits in response to the second enable signal and a count value of the counter.

4. A semiconductor integrated circuit comprising:

a number of drive circuits respectively coupled to a number of drive targets arranged in parallel;

a number of memory circuits respectively coupled to the drive circuits;

a first counter, set to an initial state by an external enable signal, for counting operation according to an external clock signal;

a second counter set to an initial state by the external enable signal, for counting according to a count indication signal fed from the first counter;

a coincidence detecting circuit for detecting when the count value of the second counter coincides with address information input to the integrated circuit; and a plurality of decoders, respectively coupled to the memory circuits, activated by the enable signal fed from the coincidence detecting circuit, for directing storage of external driving data with respect to the memory circuits in response to the count value of the first counter;

wherein the first counter feeds a count indication signal to the second counter when a count value corresponding to the number of decoders is counted, and the coincidence detecting circuit feeds an enable signal to the number of decoders when the count value of the second counter coincides with the address information.

* * * * *